(12) United States Patent
He

(10) Patent No.: US 11,568,922 B2
(45) Date of Patent: *Jan. 31, 2023

(54) UNDER-MEMORY ARRAY PROCESS EDGE MATS WITH SENSE AMPLIFIERS

(71) Applicant: MICRON TECHNOLOGY, INC., Boise, ID (US)

(72) Inventor: Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/332,890

(22) Filed: May 27, 2021

(65) Prior Publication Data

US 2021/0335412 A1    Oct. 28, 2021

Related U.S. Application Data

(63) Continuation of application No. 16/858,475, filed on Apr. 24, 2020, now Pat. No. 11,024,366.

(51) Int. Cl.
*G11C 16/04* (2006.01)
*G11C 11/4091* (2006.01)
*H01L 23/528* (2006.01)
*H01L 27/108* (2006.01)

(52) U.S. Cl.
CPC ........ *G11C 11/4091* (2013.01); *H01L 23/528* (2013.01); *H01L 27/10814* (2013.01); *H01L 27/10882* (2013.01); *H01L 27/10897* (2013.01)

(58) Field of Classification Search
CPC .................................................. G11C 11/4091
See application file for complete search history.

(56) References Cited

U.S. PATENT DOCUMENTS

| | | | |
|---|---|---|---|
| 9,159,400 B2* | 10/2015 | Ferrant | G11C 11/4091 |
| 10,269,420 B2 | 4/2019 | Chen et al. | |
| 11,024,366 B1* | 6/2021 | He | G11C 7/065 |
| 11,087,827 B1* | 8/2021 | He | H01L 27/10894 |
| 2008/0266974 A1 | 10/2008 | Sanjeevarao et al. | |
| 2012/0044734 A1* | 2/2012 | Lee | G11C 7/065 |
| | | | 365/63 |
| 2018/0025757 A1 | 1/2018 | Chan et al. | |
| 2020/0105661 A1 | 4/2020 | Ishihara et al. | |

OTHER PUBLICATIONS

U.S. Appl. No. 16/858,475, titled "Under-Memory Array Process Edge Mats With Sense Amplifiers", dated Apr. 24, 2020.

* cited by examiner

*Primary Examiner* — Pho M Luu
(74) *Attorney, Agent, or Firm* — Dorsey & Whitney LLP

(57) ABSTRACT

An edge memory array mat with access lines that are split, and a bank of sense amplifiers formed under the edge memory array may in a region that separates the access line segment halves. The sense amplifiers of the bank of sense amplifiers are coupled to opposing ends of a first subset of the half access lines pairs. The edge memory array mat further includes access line connectors configured to connect a second subset of the half access line pairs across the region occupied by the bank of sense amplifiers to form combined or extended access lines that extend to a bank of sense amplifiers coupled between the edge memory array mat and an inner memory array mat.

20 Claims, 6 Drawing Sheets

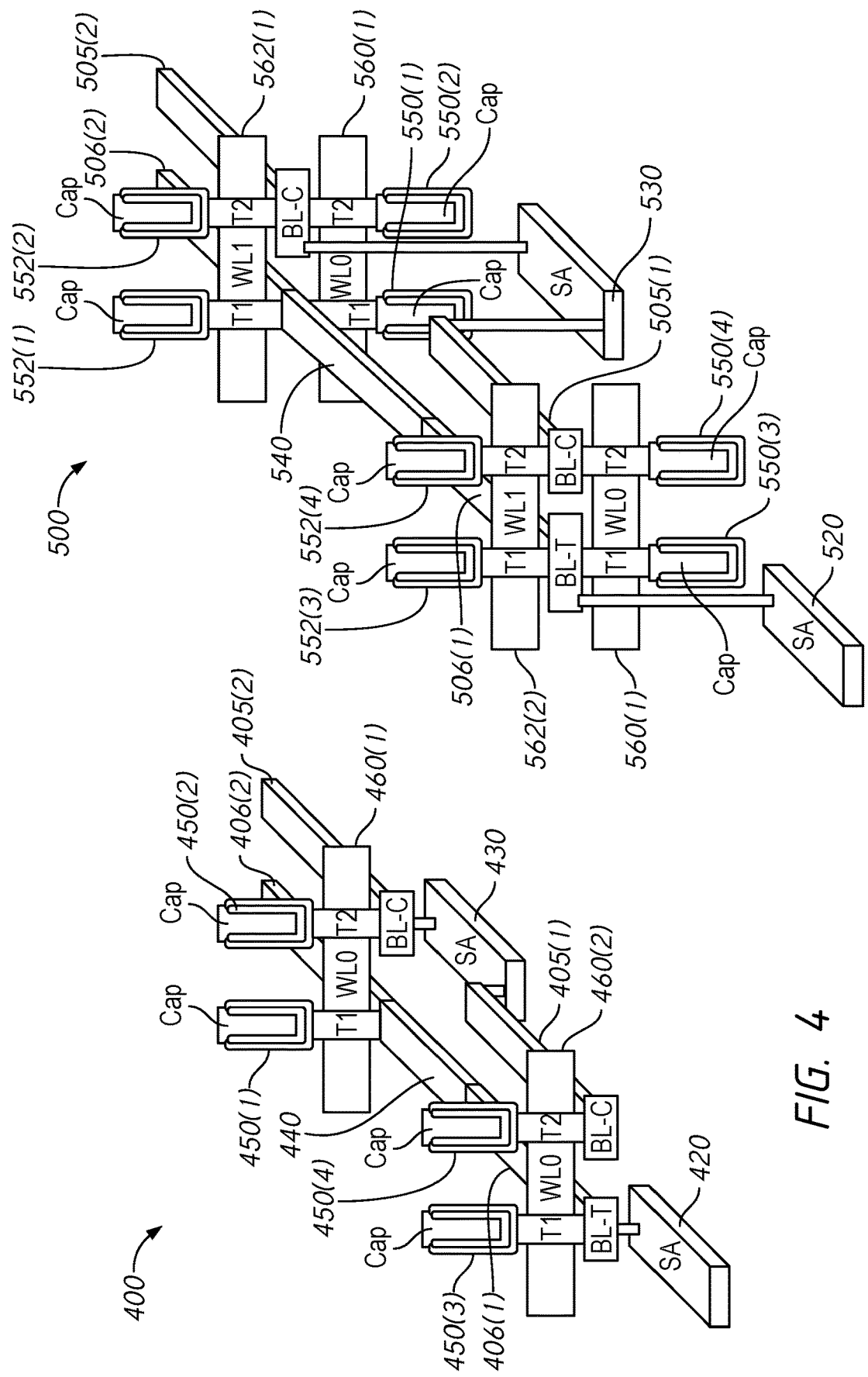

UNDER-MEMORY ARRAY PROCESS EDGE MATS WITH SENSE AMPLIFIERS

CROSS-REFERENCE TO RELATED APPLICATION

This application is a continuation of U.S. patent application Ser. No. 16/858,475, filed Apr. 24, 2020, issued as U.S. Pat. No. 11,024,366 on Jun. 1, 2021. This application and patent are incorporated by reference herein in their entirety and for all purposes.

BACKGROUND

Current implementations of dynamic random-access memory (DRAM) device arrays implement row segment sections where even and odd row segments of memory cells are interleaved. Sense amplifiers are connected to sequential row segments, and use one of the two row segments as reference when reading the other row segment. As a result, at the edges of an array, the row segments sections include border row segments. These border segments are interleaved with other row segment sections, but the other row segment sections are not connected to circuitry that allows them to be used for storing data. Therefore, in these border row segment sections, only half of the memory cells in the section are used to store data. Because only half of the memory cells are used, significant areas around the edge of an array are consumed by unused memory cells.

BRIEF DESCRIPTION OF THE DRAWINGS

FIG. 4 illustrates a simplified schematic block diagram of a portion of a memory array in accordance with an embodiment of the disclosure.

FIG. 5 illustrates a perspective view of a schematic diagram of a portion of a memory array in accordance with an embodiment of the disclosure.

DETAILED DESCRIPTION

Figure 1:
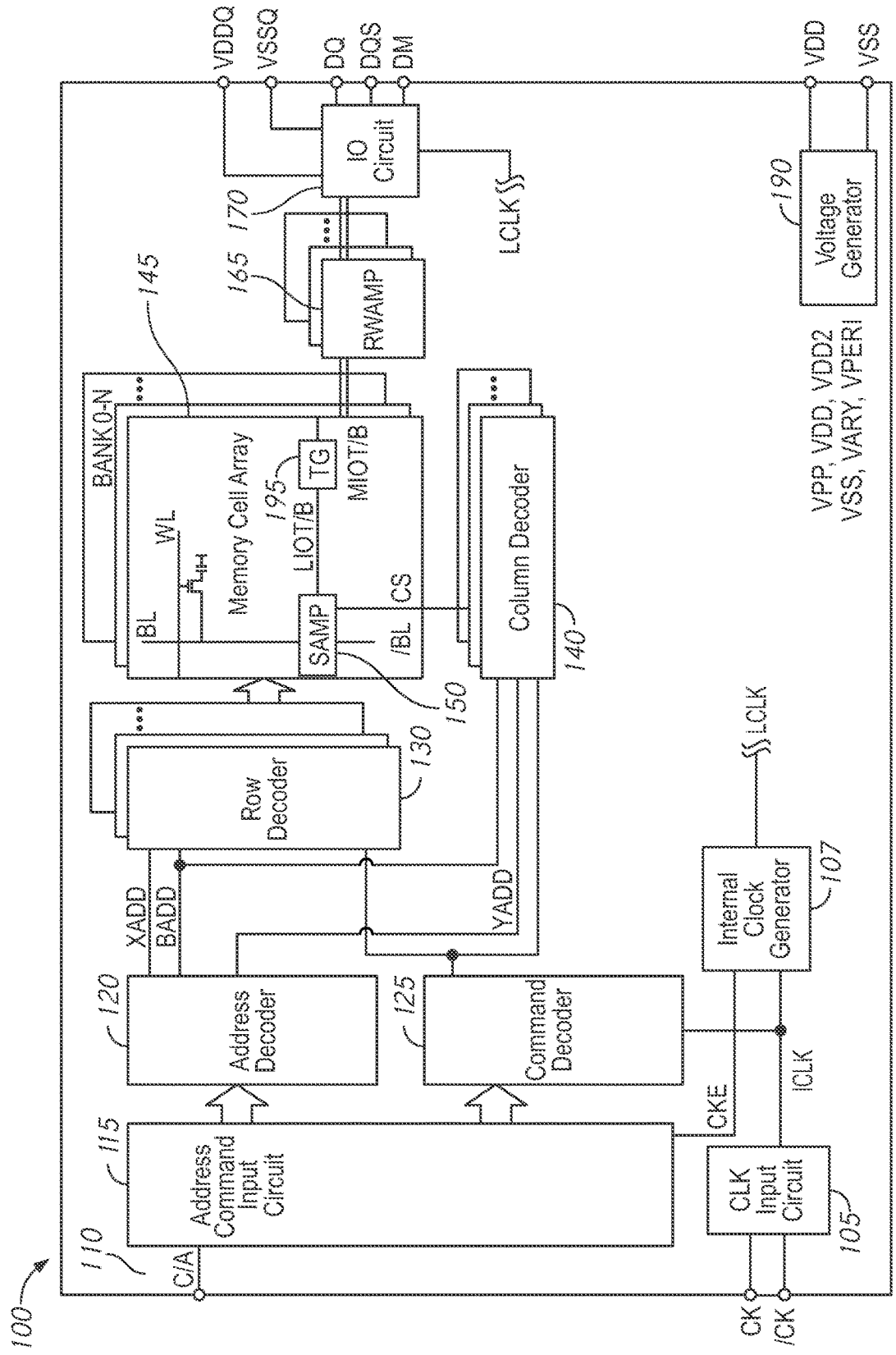
FIG. 1 illustrates a schematic block diagram of a semiconductor device in accordance with an embodiment of the present disclosure.

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

This disclosure describes memory array implementations where all memory cells of an edge memory array mat in a stacked or three-dimensional (3D) memory mat with under-array complementary metal oxide semiconductor (CMOS) circuitry may be configured to be used to store and access data. An edge memory array mat in this configuration may include digit lines (e.g., access lines, bitlines, data input/output (I/O) lines, etc.) that are split in half and a bank of sense amplifiers formed below the edge memory array mat in a region where the digit line are split. The sense amplifiers of the bank of sense amplifiers are coupled to opposing ends of a first subset of the half digit lines pairs (e.g., complementary digit lines formed from individual halves of the first subset of the half digit lines pairs). The edge memory array mat further includes digit line (DL) connectors to re-connect a second subset of the half digit line pairs across the region occupied by the bank of sense amplifiers to form combined or extended digit lines that extend to a bank of sense amplifiers coupled between the edge memory array mat and an inner memory array mat (e.g., complementary digit lines formed from the combined or extended digit line and a digit line of the inner memory array mat). In another example, only the half of the digit lines that are coupled to the bank of sense amplifiers below the edge memory array mat are split during fabrication, with the other half formed continuously across the edge memory array mat (e.g., without having to later add a connector to connect two halves).

During fabrication, digit lines may be formed in a memory array mat with an interleaved arrangement such that even digit lines are configured to couple to a first bank of sense amplifiers at a first end and odd digit lines are configured to couple to a second bank of sense amplifiers at a second end opposite the first end. To perform a sense operation, sense amplifiers are coupled to two complementary digit lines in such a way that the data state of a memory cell coupled to one of the two complementary digit lines causes the sense amplifier to drive one digit line to a first logical value and the other digit line to a second logical value opposite the first logical value. Thus, the first bank of sense amplifiers may be coupled to a respective second set of digit lines of a first adjacent memory array mat and second bank of sense amplifiers may be coupled to a respective second set of digit lines of a second adjacent memory array mat. For an edge memory array mat that forms an outer edge of a memory array, one set of interleaved digit lines may be coupled to a first bank of sense amplifiers formed near a first (inner) end between the edge memory array mat and an inner memory array mat. However, because a sense amplifier may be coupled between two complementary digit lines or loads to perform a sense operation, the second set of digit lines of the edge memory array mat may be unable to support a sense amplifier coupled to the second (outer) end near an edge of the memory array, as there is no set of complementary digit lines to support operation of the sense amplifier.

Thus, to avoid edge memory array mats having half of the digit lines (and corresponding memory cells) being unused, a first subset of the digit lines of the edge memory array mat may be split (e.g., or divided) in two to form complementary pairs, with each end coupled to a respective sense amplifier of a bank of sense amplifiers formed in a region under an the edge memory array mat adjacent the space or region where the first subset of the digit lines are split. A second subset of the digit lines of the edge memory array mat may extend continuously across the edge memory array mat to couple to a second bank of sense amplifiers formed adjacent an area between the edge memory mat and an inner memory array mat. In some examples, all of the digit lines of the edge memory array mat may be split during production, with a connector added to reconnect the second subset of digit lines together. The digit lines and the digit line connector may be formed, at least in part, using a first metal layer, and the bank of sense amplifiers and other circuitry may be formed using at least a second metal layer. The single edge memory array mat may include a one transistor, one capacitor (1T1C) memory array architecture.

In a two transistor, two capacitor (2T2C) memory array architecture, a similar approach may be implemented for the two stacked edge memory array mats. A 2T2C architecture includes a first memory array mat stacked with a second memory array mat, with a respective row of the first memory array mat sharing a digit line with a respective row of the second memory array mat. In some examples, the shared digit lines may be formed between the first and second memory array mats. In this example, as with the single edge memory array mat, a first subset of the digit lines shared by the first and second edge memory array mats may be split (e.g., or divided) in two to form complementary pairs, with each end coupled to a respective sense amplifier of a bank of sense amplifiers formed in a region under an the first and second edge memory array mats adjacent the space or region where the first subset of shared digit lines are split. A second subset of the shared digit lines of the first and second edge memory array mat may extend continuously along the first and second edge memory array mats to couple to a second bank of sense amplifiers formed adjacent an area between the first and second edge memory array mats and a pair of stacked inner memory array mats.

Splitting half of the digit lines into complementary pairs and coupling each complementary pair to a respective sense amplifier of a bank of sense amplifiers formed under an edge memory array mat may more efficiently use memory cells of the edge memory array mat by avoiding half of the digit lines (and corresponding memory cells) from being unused during operation of the memory. This allows for greater memory density as compared with implementations that include unused digit lines in edge memory array mats.

FIG. 1 illustrates a schematic block diagram of a semiconductor device 100 in accordance with an embodiment of the present disclosure. The semiconductor device 100 includes a memory die. The memory die may include a command/address input circuit 115, an address decoder 120, a command decoder 125, a clock input circuit 105, internal clock generator 107, row decoder 130, column decoder 140, a memory cell array 145, read/write amplifiers 165, an I/O circuit 170, and power circuit 190.

In some embodiments, the semiconductor device 100 may include, without limitation, a dynamic random-access memory (DRAM) device, such as double data rate (DDR) DDR4, DDR5, low power(LP) DDR, integrated into a single semiconductor chip, for example. The die may be mounted on an external substrate, for example, a memory module substrate, a mother board or the like. The semiconductor device 100 may further include a memory cell array 145. The memory cell array 145 includes a plurality of banks, each bank including a plurality of word lines WL, a plurality of bit lines BL (e.g., digit lines, access lines, data I/O lines, etc.), and a plurality of memory cells MC arranged at intersections of the plurality of word lines WL and the plurality of bit lines BL. The selection of the word line WL is performed by a row decoder 130 and the selection of the bit line BL (along with a column select signal CS) is performed by a column decoder 140. Sense amplifiers (SA) 150 are located near their corresponding bit lines BL and connected to at least one respective local I/O line based on the CS signal, which is in turn coupled to a respective one of at least two main I/O line pairs, via transfer gates (TG) 195, which function as switches.

In some embodiments, the memory cell array 145 may include memory array mats having respective digit lines and memory cells. The memory array mats may be separated by areas for control circuitry, including the sense amplifiers 150 connected to a respective subset (e.g., even or odd) bitlines of adjacent memory array mats to perform sense operations on corresponding memory cells. In some examples, a bank of sense amplifiers 150 positioned between two inner memory array mats or positioned between an inner memory array mat and an edge memory array mat (i.e., a memory array mat that includes one edge defining a portion of an outer border of the memory cell array 145) may each be coupled between a respective subset (e.g., even or odd) of complementary bitline pairs, and may be configured to perform a sense operation on a memory cell coupled to one bitline of a corresponding complementary bitline pair of the respective subset of bitline pairs.

In some examples, the memory cell array 145 may include a stacked or three-dimensional (3D) architecture with under-array complementary metal oxide semiconductor (CMOS) circuitry used to store and access data implementations. The bitlines BL and/BL of an edge memory array mat in this configuration may be split in half and a bank of sense amplifiers 150 formed below the edge memory array mat in a region where the bitlines BL and/BL are split. The sense amplifiers 150 of the bank of sense amplifiers 150 are coupled to opposing ends of a first subset of the half bitline pairs (e.g., complementary bitlines formed from individual halves of the first subset of the half digit lines pairs). The edge memory array mat further includes bitline connectors to re-connect a second subset of the half bitline pairs across the region occupied by the bank of sense amplifiers 150 to form combined or extended bitlines that extend to a bank of sense amplifiers 150 coupled between the edge memory array mat and an inner memory array mat (e.g., complementary bitlines formed from the combined or extended bitline and a bitline of the inner memory array mat). In another example, only the half of the bitlines that are coupled to the bank of sense amplifiers 150 below the edge memory array mat are split during fabrication, with the other half formed continuously across the edge memory array mat (e.g., without having to later add a connector to connect two halves).

During fabrication, bitlines may be formed in a memory array mat with an interleaved arrangement such that even bitlines are configured to couple to a first bank of sense amplifiers 150 at a first end and odd bitlines are configured to couple to a second bank of sense amplifiers 150 at a second end opposite the first end. To perform a sense operation, sense amplifiers 150 are coupled to two complementary bitlines in such a way that the data state of a memory cell coupled to one of the two complementary bitlines causes the sense amplifier 150 to drive one digit line to a first logical value and the other bitline to a second logical value opposite the first logical value. Thus, the first bank of sense amplifiers 150 may be coupled to a respective second set of bitlines of a first adjacent memory array mat and second bank of sense amplifiers 150 may be coupled to a respective second set of bitlines of a second adjacent memory array mat. For an edge memory array mat that forms an outer edge of a memory cell array 145, one set of interleaved bitlines may be coupled to a first bank of sense amplifiers 150 formed near a first (inner) end between the edge memory array mat and an inner memory array mat. However, because a sense amplifier 150 may be coupled between two complementary bitlines or loads to perform a sense operation, the second set of bitlines of the edge memory array mat may be unable to support a sense amplifier 150 coupled to the second (outer) end near an edge of the memory cell array 145, as there is no set of complementary digit lines to support operation of the sense amplifier 150.

Thus, to avoid edge memory array mats having half of the bitlines (and corresponding memory cells) being unused, a first subset of the bitlines of the edge memory array mat may be split (e.g., or divided) in two to form complementary pairs, with each end coupled to a respective sense amplifier 150 of a bank of sense amplifiers formed in a region under an the edge memory array mat adjacent the space or region where the first subset of the bitlines are split. A second subset of the bitlines of the edge memory array mat may extend continuously across the edge memory array mat to couple to a second bank of sense amplifiers formed adjacent an area between the edge memory mat and an inner memory array mat. In some examples, all of the bitlines of the edge memory array mat may be split during production, with a connector added to reconnect the second subset of bitlines together. The bitlines and the bitline connector may be formed, at least in part, using a first metal layer, and the bank of sense amplifiers 150 and other circuitry may be formed using at least a second metal layer. The single edge memory array mat may include a one transistor, one capacitor (1T1C) memory array architecture.

In a two transistor, two capacitor (2T2C) memory array architecture, a similar approach may be implemented for the two stacked edge memory array mats. A 2T2C architecture includes a first memory array mat stacked with a second memory array mat, with a respective row of the first memory array mat sharing a bitline with a respective row of the second memory array mat. In some examples, the shared bitlines may be formed between the first and second memory array mats. In this example, as with the single edge memory array mat, a first subset of the bitlines shared by the first and second edge memory array mats may be split (e.g., or divided) in two to form complementary pairs, with each end coupled to a respective sense amplifier of a bank of sense amplifiers 150 formed in a region under an the first and second edge memory array mats adjacent the space or region where the first subset of shared bitlines are split. A second subset of the shared bitlines of the first and second edge memory array mat may extend continuously along the first and second edge memory array mats to couple to a second bank of sense amplifiers 150 formed adjacent an area between the first and second edge memory mats and a pair of stacked inner memory array mats.

Splitting half of the bitlines into complementary pairs and coupling each complementary pair to a respective sense amplifier 150 of a bank of sense amplifiers formed under an edge memory array mat may more efficiently use memory cells of the edge memory array mat by avoiding half of the bitlines (and corresponding memory cells) from being unused during operation of the semiconductor device 100. This allows for greater memory density as compared with implementations that include unused bitlines in edge memory array mats.

The semiconductor device 100 may employ a plurality of external terminals that include address and command terminals coupled to command/address bus (C/A), clock terminals CK and/CK, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside via command/address bus 110. The address signal and the bank address signal supplied to the address terminals are transferred, via the command/address input circuit 115, to an address decoder 120. The address decoder 120 receives the address signal and decodes the address signal to provide decoded address signal ADD. The ADD signal includes a decoded row address signal and a decoded column address signal. The decoded row address signal is provided to the row decoder 130, and a decoded column address signal is provided to the column decoder 140. The address decoder 120 also receives the bank address signal and supplies the bank address signal to the row decoder 130, the column decoder 140.

The command/address terminals may further be supplied with a command signal from outside, such as, for example, a memory controller. The command signal may be provided, via the C/A bus, to the command decoder 125 via the command/address input circuit 115. The command decoder 125 decodes the command signal to generate various internal commands that include a row command signal ACT to select a word line and a column command signal Read/Write, such as a read command or a write command, to select a bit line, and a test mode signal.

Accordingly, when a read command is issued and a row address and a column address are timely supplied with the read command, read data is read from a memory cell in the memory cell array 145 designated by these row address and column address. The read data DQ is output to outside from the data terminals DQ (data), DQS (data strobe), and DM (data mask) via read/write amplifiers 165 and an input/output circuit 170. Similarly, when the write command is issued and a row address and a column address are timely supplied with this command, and then write data is supplied to the data terminals DQ, DQS, DM, the write data is received by data receivers in the input/output circuit 170, and supplied via the input/output circuit 170 and the read/write amplifiers 165 to the memory cell array 145 and written in the memory cell designated by the row address and the column address.

Turning to the explanation of the external terminals included in the semiconductor device 100, the clock terminals CK and/CK are supplied with an external clock signal and a complementary external clock signal, respectively. The external clock signals (including complementary external clock signal) may be supplied to a clock input circuit 105. The clock input circuit 105 may receive the external clock signals to generate an internal clock signal ICLK. The internal clock signal ICLK is supplied to an internal clock generator 107 and thus a phase controlled internal clock signal LCLK is generated based on the received internal clock signal ICLK. Although not limited thereto, a delay-locked loop (DLL) circuit, a duty cycle correction (DCC) circuit, or a combination thereof may be used as the internal clock generator 107. The phase controlled internal clock signal LCLK may be used as a timing signal for determining an output timing of read data.

The power supply terminals are supplied with power supply potentials VDD and VSS. These power supply potentials VDD2 and VSS are supplied to the power circuit 190. The power circuit 190 generates various internal potentials VKK, VARY, VPERI, and the like based on the power supply potentials VDD2 and VSS. The internal potential VKK is mainly used in the row decoder 130, the internal potential VARY are mainly used in the sense amplifiers included in the memory cell array 145, and the internal potential VPERI is used in many other circuit blocks.

The power supply terminals are also supplied with power supply potentials VDDQ and VSSQ. These power supply potentials VDDQ and VSSQ are supplied to the input/output circuit 170. The power supply potentials VDDQ and VSSQ are typically the same potentials as the power supply potentials VDD2 and VSS, respectively. However, the dedicated power supply potentials VDDQ and VSSQ are used for the input/output circuit 170 so that power supply noise generated by the input/output circuit 170 does not propagate to the other circuit blocks.

Figure 2:
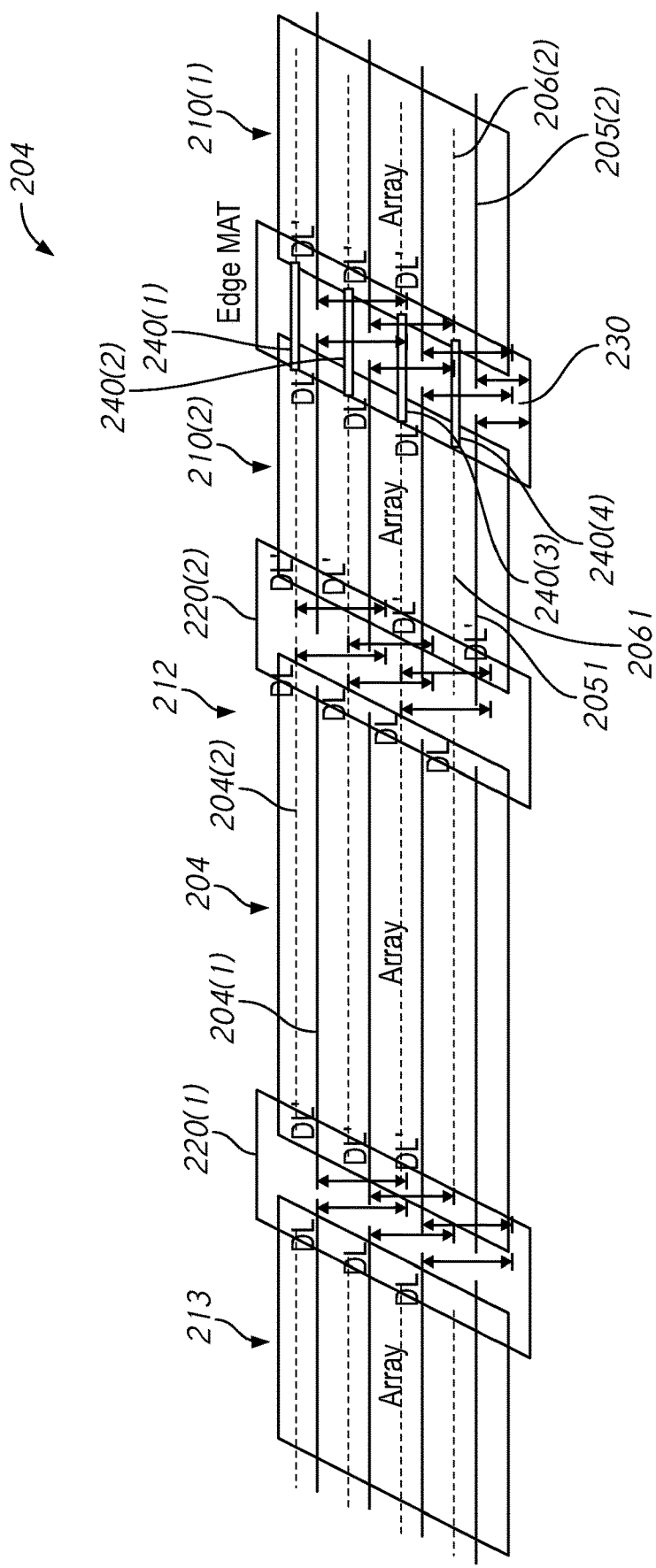
FIG. 2 illustrates a schematic block diagram of a portion of a memory array in accordance with an embodiment of the disclosure.

FIG. 2 illustrates a schematic block diagram of a portion of a memory array 200 in accordance with an embodiment of the disclosure. The memory array 200 includes an edge memory array mat 210 having two sections 210(1)-(2), an inner memory array mat 212, a portion of an inner memory array mat 213, a sense amplifier bank 220(1) positioned between the inner memory array mat 212 and the inner memory array mat 213, a sense amplifier bank 220(1) positioned between the inner memory array mat 212 and the edge memory array mat 210(1)-(2), a sense amplifier bank 230 positioned in between the sections 210(1)-(2) of the edge memory array mat 210. The memory cell array 145 of FIG. 1 may implement the memory array 200 of FIG. 2.

The inner memory array mat 212 may include individual digit line (e.g., bitline, access line, or data I/O line) segments digit line segments 204, with a first set of the digit line segments 204(1) coupled to the sense amplifier bank 220(1) and a second set of the digit line segments 204(2) interleaved with the first set coupled to the sense amplifier bank 220(2). The inner memory array mat 213 may include a similar arrangement of digit lines, with a first set coupled to the sense amplifier bank 220(1).

The edge memory array mat 210 may include pairs of digit line segments 205(1)-(2), with each pair having one digit line segment 205(1) coupled to a first section 210(1) of the edge memory array mat 210 and the other digit line segment 205(2) coupled to a second section 210(2) of the edge memory array mat 210. The pairs of digit line segments 205(1)-(2) may be coupled to the sense amplifier bank 230. The edge memory array mat 210 may further include pairs of digit line segments 206(1)-(2), with each pair having one digit line segment 206(1) coupled to a first section 210(1) of the edge memory array mat 210 and the other digit line segment 206(2) coupled to a second section 210(2) of the edge memory array mat 210. The pairs of digit line segments 206(1)-(2) may be coupled together via a respective one of the DL connectors 240(1)-(4) to form combined or extended digit line segments. The pairs of digit line segments 205(1)-(2) may be interleaved with the pairs of digit line segments 206(1)-(2). Each pair of the pairs of digit line segments 205(1)-(2) may be coupled to a respective sense amplifier of the sense amplifier bank 230 and each of the extended or combined digit line segments (e.g., pair of the pairs of digit line segments 206(1)-(2) coupled together via respective ones of the DL connectors 240(1)-(4)) may be coupled to a respective sense amplifier of the sense amplifier bank 220(2).

The DL connectors 240(1)-(4) may be formed to cross an area or region occupied by the sense amplifier bank 230 to connect one digit line segment 206(1) to a corresponding digit line segment 206(2). The DL connectors 240(1)-(4) may be structurally formed using the same layer as the pairs of digit line segments 205(1)-(2), the pairs of digit line segments 206(1)-(2). Each of the DL connectors 240(1)-(4) may be constructed from a conductive material. For example, the digit line segment 205(1), the digit line segment 205(2), the digit line segment 206(1), the digit line segment 206(2), and the DL connectors 240(1)-(4) may be formed, at least in part, using a first metal layer. The bank of sense amplifiers 230 may be formed using a second metal layer portion that that is above or below the first metal layer. The second metal layer may be above or below the first metal layer, in some examples.

In some examples, the memory array 200 may implement a stacked or 3D architecture such that the inner memory 212, the inner memory array mat 213, and the edge memory array mat 210 include multiple stacked or 3D memory array mats. In some examples, the inner memory array mat 212, the inner memory array mat 213, and the edge memory array mat 210 may implement a 1T1C architecture, where each of the digit lines 204, and digit line pairs 205(1)-(2) and 206(1)-(2) are coupled to a single cell at each row (e.g., activated by a common wordline (not shown). In other examples, the inner memory array mat 212, the inner memory array mat 213, and the edge memory array mat 210 may implement a 2T2C architecture, where each of the digit lines 204, and digit line pairs 205(1)-(2) and 206(1)-(2) are coupled to two parallel rows of memory cells (e.g., each independently activated responsive to a different respective wordline).

Each individual digit line segment of the pairs of digit line segments 205(1)-(2) and the pairs of digit line segments 206(1)-(2) may have a length (e.g., based on a number of coupled rows of memory cells (not shown)) that is half of a length of the digit line segments 204 of the inner memory array mat 212. For example, each of the digit line segment 205(1), the digit line segment 205(2), the digit line segment 206(1), and the digit line segment 206(2) may have a length of N thousand (NK) rows, and each of the digit line segments 204 may have a length of 2NK rows. In some examples, N may be equal to any integer, such as 1, 2, 4, 8, etc.

A NK plus NK or 2NK length of the combined or extended digit line segments (e.g., the pairs of digit line segments 206(1)-(2) connected together by one of the DL connectors 240(1)-(4)) may match the 2NK length of each of the digit line segments 204. For example, the combined or extended digit line segment that includes the DL connector 240(1) and the digit line 204(1) may form complementary 2NK length digit lines that are coupled to a particular sense amplifier of the sense amplifier bank 220(2). Differences in relative lengths of a pair of digit line coupled to any sense amplifier of any of the sense amplifier bank 220(1), sense amplifier bank 220(2), or the sense amplifier bank 230 may negatively affect operation of the sense amplifier due to capacitive and impedance differences. Thus, because the digit line segment 205(1) and the digit line segment 205(2) have a common NK length, the sense amplifiers of the sense amplifier bank 230 being coupled to individual pairs of the pairs of digit line segments 205(1)-(2) may experience similar capacitive and impedance loads on coupled digit line segments 205(1) and 205(2). Similarly, because each of the digit line segments 204 and the combined or extended digit line segments (e.g., a pair of the digit line segments 206(1)-(2) coupled together via the DL connectors 240(1)-(4)) have a common 2NK length, the sense amplifiers of the sense amplifier bank 220(2) may experience similar capacitive and impedance loads. The digit lines coupled to the sense amplifier bank 220(1) has a similar architecture with digit lines of common length.

In some examples, sense amplifier of the sense amplifier bank 230 may be schematically similar to sense amplifiers of the sense amplifier banks 220(1) and the sense amplifier bank 220(2). In some examples, components of the sense amplifiers of the sense amplifier bank 230 may have a different (e.g., smaller) size than schematically common components of the sense amplifier bank 220(1) and the sense amplifier bank 220(2) to accommodate the differences in digit line segment lengths (e.g., NK vs. 2NK). The sense amplifiers of the sense amplifier bank 230(1) having smaller components than the sense amplifiers of the sense amplifier bank 220(1) and the sense amplifier bank 220(2) may result in a smaller layout area for the sense amplifiers of the sense amplifier bank 230 as compared with the sense amplifiers of the sense amplifier bank 220(1) and the sense amplifier bank 220(2). In other examples, the sense amplifier bank 230 may be schematically different than the sense amplifier bank 220(1) and the sense amplifier bank 220(2). For example, the sense amplifier bank 230 may include basic sense amplifier circuitry and the sense amplifier bank 220(1) and the sense amplifier bank 220(2) may include threshold voltage compensation circuitry in addition to the basic sense amplifier circuitry to accommodate sensing data on longer digit line segments digit line segments 204 and the respective combinations of the digit line segment 206(1), one of the DL connectors 240(1)-(4), and the digit line segment 206(2).

While FIG. 2 depicts the inner memory array mat 212 with 8 of the digit line segments digit line segments 204 and depicts the pair edge memory array mat 210 with 8 pairs of digit line segments (e.g., 4 of the pairs of digit line segments 205(1)-(2) and 4 of the pairs of digit line segments 206(1)-(2)), it is appreciated that the inner memory array mat 212 and each of the pair edge memory array mats 210(1)-(2) may include more than 8 digit line segments.

Figure 3:
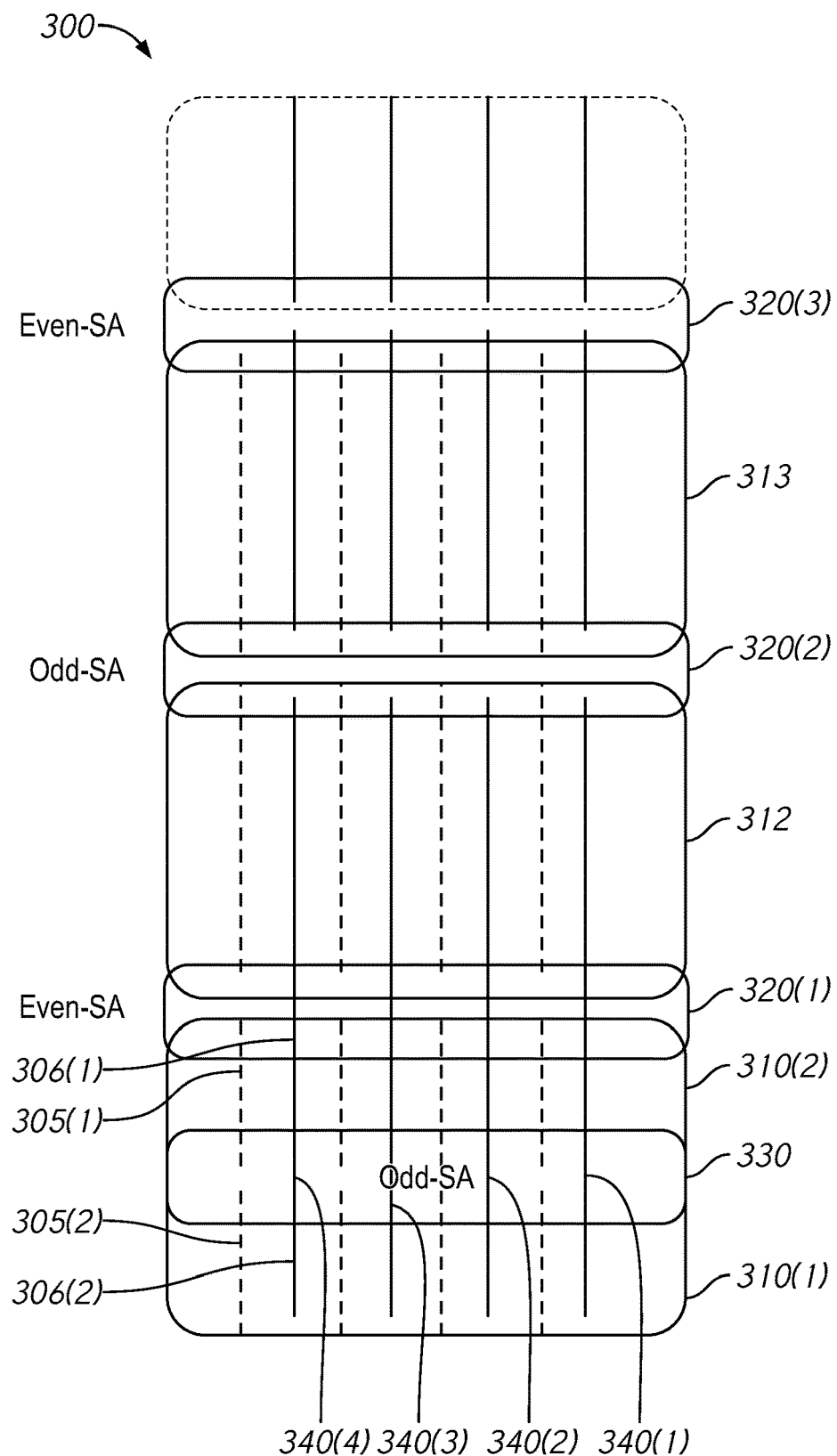
FIG. 3 illustrates a perspective view of a schematic diagram of a portion of an edge memory array mat in accordance with an embodiment of the disclosure.

FIG. 3 illustrates a planar view of a portion of a memory array 300 in accordance with an embodiment of the disclosure. The memory array 300 includes an edge memory array mat 310 having two sections 310(1)-(2), an inner memory array mat 312, a portion of an inner memory array mat 313, a sense amplifier bank 320(1) positioned between the inner memory array mat 312 and the inner memory array mat 313, a sense amplifier bank 320(2) positioned between the inner memory array mat 312 and the edge memory array mat 310(1)-(2), a sense amplifier bank 330 positioned in between the sections 310(1)-(2) of the edge memory array mat 310. The memory cell array 145 of FIG. 1 and/or the memory array 200 of FIG. 2 may implement the memory array 300 of FIG. 3.

The inner memory array mat 312 may include individual digit line (e.g., bitline, access line, or data I/O line) segments digit line segments, with a first set of the digit line segments coupled to the sense amplifier bank 320(1) and a second set of the digit line segments interleaved with the first set coupled to the sense amplifier bank 320(2). The inner memory array mat 313 may include a similar arrangement of digit lines, with a first set coupled to the sense amplifier bank 320(1).

The edge memory array mat 310 may include pairs of digit line segments 305(1)-(2), with each pair having one digit line segment 305(1) coupled to a first section 310(1) of the edge memory array mat 310 and the other digit line segment 305(2) coupled to a second section 310(2) of the edge memory array mat 310. The pairs of digit line segments 305(1)-(2) may be coupled to the sense amplifier bank 330. The edge memory array mat 310 may further include pairs of digit line segments 306(1)-(2), with each pair having one digit line segment 306(1) coupled to a first section 310(1) of the edge memory array mat 310 and the other digit line segment 306(2) coupled to a second section 310(2) of the edge memory array mat 310. The pairs of digit line segments 306(1)-(2) may be coupled together via a respective one of the DL connectors 340(1)-(6) to form combined or extended digit line segments. The pairs of digit line segments 305(1)-(2) may be interleaved with the pairs of digit line segments 306(1)-(2). Each pair of the pairs of digit line segments 305(1)-(2) may be coupled to a respective sense amplifier of the sense amplifier bank 330 and each of the extended or combined digit line segments (e.g., pair of the pairs of digit line segments 306(1)-(2) coupled together via respective ones of the DL connectors 340(1)-(4)) may be coupled to a respective sense amplifier of the sense amplifier bank 320(2).

The DL connectors 340(1)-(4) may be formed to cross an area or region occupied by the sense amplifier bank 330 to connect one digit line segment 306(1) to a corresponding digit line segment 306(2). The DL connectors 340(1)-(4) may be structurally formed using the same layer as the pairs of digit line segments 305(1)-(2), the pairs of digit line segments 306(1)-(2). Each of the DL connectors 340(1)-(4) may be constructed from a conductive material. For example, the digit line segment 305(1), the digit line segment 305(2), the digit line segment 306(1), the digit line segment 306(2), and the DL connectors 340(1)-(4) may be formed, at least in part, using a first metal layer. The bank of sense amplifiers 330 may be formed using a second metal layer portion that that is above or below the first metal layer. The second metal layer may be above or below the first metal layer, in some examples.

In some examples, the memory array 300 may implement a stacked or 3D architecture such that the inner memory 312, the inner memory array mat 313, and the edge memory array mat 310 include multiple stacked or 3D memory array mats. In some examples, the inner memory array mat 312, the inner memory array mat 313, and the edge memory array mat 310 may implement a 1T1C architecture, where each of the digit lines of the inner memory array mats 312 and inner memory array mat 313, and digit line pairs 305(1)-(2) and 306(1)-(2) are coupled to a single cell at each row (e.g., activated by a common wordline (not shown). In other examples, the inner memory array mat 312, the inner memory array mat 313, and the edge memory array mat 310 may implement a 2T2C architecture, where each of the digit lines of the inner memory array mats 312 and inner memory array mat 313, and digit line pairs 305(1)-(2) and 306(1)-(2) are coupled to two parallel rows of memory cells (e.g., each independently activated responsive to a different respective wordline).

Each individual digit line segment of the pairs of digit line segments 305(1)-(2) and the pairs of digit line segments 306(1)-(2) may have a length (e.g., based on a number of coupled rows of memory cells (not shown)) that is half of a length of the digit line segments 304 of the inner memory array mat 312. For example, each of the digit line segment 305(1), the digit line segment 305(2), the digit line segment 306(1), and the digit line segment 306(2) may have a length of N thousand (NK) rows, and each of the digit line segments 304 may have a length of 2NK rows. In some examples, N may be equal to any integer, such as 1, 2, 4, 8, etc.

A NK plus NK or 2NK length of the combined or extended digit line segments (e.g., the pairs of digit line segments 306(1)-(2) connected together by one of the DL connectors 340(1)-(4)) may match the 2NK length of each of the digit line segments 304. For example, the combined or extended digit line segment that includes the DL connector 340(1) and the digit line of the inner memory array mat 312 may form complementary 2NK length digit lines that are coupled to a particular sense amplifier of the sense amplifier bank 320(2). Differences in relative lengths of a pair of digit line coupled to any sense amplifier of any of the sense amplifier bank 320(1), sense amplifier bank 320(2), or the sense amplifier bank 330 may negatively affect operation of the sense amplifier due to capacitive and impedance differences. Thus, because the digit line segment 305(1) and the digit line segment 305(2) have a common NK length, the sense amplifiers of the sense amplifier bank 330 being coupled to individual pairs of the pairs of digit line segments 305(1)-(2) may experience similar capacitive and impedance loads on coupled digit line segments 305(1) and 305(2). Similarly, because each of the digit line segments 304 and the combined or extended digit line segments (e.g., a pair of the digit line segments 306(1)-(2) coupled together via the DL connectors 340(1)-(4)) have a common 2NK length, the sense amplifiers of the sense amplifier bank 320(2) may experience similar capacitive and impedance loads. The digit lines coupled to the sense amplifier bank 320(1) has a similar architecture with digit lines of common length.

In some examples, sense amplifier of the sense amplifier bank 330 may be schematically similar to sense amplifiers of the sense amplifier banks 320(1) and the sense amplifier bank 320(2). In some examples, components of the sense amplifiers of the sense amplifier bank 330 may have a different (e.g., smaller) size than schematically common components of the sense amplifier bank 320(1) and the sense amplifier bank 320(2) to accommodate the differences in digit line segment lengths (e.g., NK vs. 2NK). The sense amplifiers of the sense amplifier bank 330(1) having smaller components than the sense amplifiers of the sense amplifier bank 320(1) and the sense amplifier bank 320(2) may result in a smaller layout area for the sense amplifiers of the sense amplifier bank 330 as compared with the sense amplifiers of the sense amplifier bank 320(1) and the sense amplifier bank 320(2). In other examples, the sense amplifier bank 330 may be schematically different than the sense amplifier bank 320(1) and the sense amplifier bank 320(2). For example, the sense amplifier bank 330 may include basic sense amplifier circuitry and the sense amplifier bank 320(1) and the sense amplifier bank 320(2) may include threshold voltage compensation circuitry in addition to the basic sense amplifier circuitry to accommodate sensing data on longer digit line segments digit line segments 304 and the respective combinations of the digit line segment 306(1), one of the DL connectors 340(1)-(4), and the digit line segment 306(2).

While FIG. 3 depicts the inner memory array mat 312 with 8 of the digit line segments digit line segments 304 and depicts the pair edge memory array mat 310 with 8 pairs of digit line segments (e.g., 4 of the pairs of digit line segments 305(1)-(2) and 4 of the pairs of digit line segments 306(1)-(2)), it is appreciated that the inner memory array mat 312 and each of the pair edge memory array mats 310(1)-(2) may include more than 8 digit line segments.

FIG. 4 illustrates a perspective view of a schematic diagram of a portion of a memory array 400 implementing a 1T1C architecture in accordance with an embodiment of the disclosure. The memory array 400 includes an edge memory array mat 410, a sense amplifier bank 430 positioned in the edge memory array mat 410, and a sense amplifier 430 positioned between the edge memory array mat 410 and an inner memory array mat (not shown). Any of the memory cell array 145 of FIG. 1, the memory array 200 of FIG. 2, and/or the memory array 300 of FIG. 3 may implement one or more of the portion of the memory array 400, in some examples.

The edge memory array mat 410 may include a pair of digit line segments 405(1)-(2) arranged on either side of and coupled to the sense amplifier 430. The edge memory array mat 410 may further include a pair of digit line segments 406(1)-(2) arranged on either side of and coupled together via a DL connector 440 to form a combined or extended digit line segment, with the 406(1) coupled to the sense amplifier 420. The pair of digit line segments 405(1)-(2) may be interleaved with the pair of digit line segments 406(1)-(2).

The DL connector 440 may be formed to cross an area occupied by the sense amplifier 430 to connect the digit line segment 406(1) to the digit line segment 406(2). The DL connector 440 may be structurally formed the same layer as the pair of digit line segments 405(1)-(2), the pair of digit line segments 406(1)-(2), with the sense amplifier 430 and the sense amplifier 420 formed using a different layer. The DL connector 440 may be constructed from a conductive material.

Each individual digit line segment of the pair of digit line segments 405(1)-(2) and the pair of digit line segments 406(1)-(2) may have a common length (e.g., based on a number of coupled rows of memory cells 450(1)-(4). For example, the digit line segment 406(2) may be coupled to the memory cell 450(1) in the same row as the memory cell 450(2) coupled to the digit line segment 405(2) (e.g., activated by the T1 and T2 transistors, respectively, in response to the coupled wordline WL0). Similarly, the digit line segment 406(1) may be coupled to the memory cell 450(3) in the same row as the memory cell 450(4) coupled to the digit line segment 405(1) (e.g., activated by the T1 and T2 transistors, respectively, in response to the coupled wordline WL1). Each of the digit line segment 405(1), the digit line segment 405(2), the digit line segment 406(1), and the digit line segment 406(2) may have a length of N thousand (NK) rows of memory cells. Coupling the pair of digit line segments 406(1)-(2) together via the DL connector 440 may provide a digit line segment having a length of 2NK rows to match the length of a digit line segment of the inner memory array. In some examples, N may be equal to any integer, such as 1, 2, 4, 8, etc.

In some examples, the sense amplifier 430 may be schematically similar to the sense amplifier 420. In some examples, components of the sense amplifier 430 may have a different (e.g., smaller) size than schematically common components of the sense amplifier 420 to accommodate the differences in digit line segment lengths (e.g., NK vs. 2NK). The sense amplifier 430 having smaller components than the sense amplifier 420 may result in a smaller layout area for the sense amplifier 430 as compared with the sense amplifier 420. In other examples, the sense amplifier 430 may be schematically different than the sense amplifier 420. For example, the sense amplifier 430 may include basic sense amplifier circuitry and the sense amplifier 420 may include threshold voltage compensation circuitry in addition to the basic sense amplifier circuitry to accommodate sensing data on longer digit line segments and the respective combination of the digit line segment 406(1), the DL connector 440, and the access line segment 406(2).

FIG. 5 illustrates a perspective view of a schematic diagram of a portion of a memory array 500 implementing a 2T2C architecture in accordance with an embodiment of the disclosure. The memory array 500 includes an edge memory array mat 510, a sense amplifier bank 530 positioned in the edge memory array mat 510, and a sense amplifier 530 positioned between the edge memory array mat 510 and an inner memory array mat (not shown). Any of the memory cell array 145 of FIG. 1, the memory array 200 of FIG. 2, and/or the memory array 300 of FIG. 3 may implement one or more of the portion of the memory array 500, in some examples.

The edge memory array mat 510 may include a pair of digit line segments 505(1)-(2) arranged on either side of and coupled to the sense amplifier 530. The edge memory array mat 510 may further include a pair of digit line segments 506(1)-(2) arranged on either side of and coupled together via a DL connector 540 to form a combined or extended digit line segment, with the 506(1) coupled to the sense amplifier 520. The pair of digit line segments 505(1)-(2) may be interleaved with the pair of digit line segments 506(1)-(2).

The DL connector 540 may be formed to cross an area occupied by the sense amplifier 530 to connect the digit line segment 506(1) to the digit line segment 506(2). The DL connector 540 may be structurally formed the same layer as the pair of digit line segments 505(1)-(2), the pair of digit line segments 506(1)-(2), with the sense amplifier 530 and the sense amplifier 520 formed using a different layer. The DL connector 540 may be constructed from a conductive material.

Each individual digit line segment of the pair of digit line segments 505(1)-(2) and the pair of digit line segments 506(1)-(2) may have a common length (e.g., based on a number of coupled rows of memory cells 550(1)-(4) and memory cells 552(1)-(4). For example, the digit line segment 506(2) may be coupled to the memory cell 550(1) in the same row as the memory cell 550(2) coupled to the digit line segment 505(2) (e.g., activated by the T1 and T2 transistors, respectively, in response to the coupled wordline WL0). The digit line segment 506(2) may be further coupled to the memory cell 552(1) in the same row as the memory cell 552(2) coupled to the digit line segment 505(2) (e.g., activated by the T1 and T2 transistors, respectively, in response to the coupled wordline WL1). Similarly, the digit line segment 506(1) may be coupled to the memory cell 550(3) in the same row as the memory cell 550(4) coupled to the digit line segment 505(1) (e.g., activated by the T1 and T2 transistors, respectively, in response to the coupled wordline WL3). Lastly, the digit line segment 506(2) may be further coupled to the memory cell 552(3) in the same row as the memory cell 552(4) coupled to the digit line segment 505(2) (e.g., activated by the T1 and T2 transistors, respectively, in response to the coupled wordline WL4). Each of the digit line segment 505(1), the digit line segment 505(2), the digit line segment 506(1), and the digit line segment 506(2) may have a length of N thousand (NK) rows of memory cells. Coupling the pair of digit line segments 506(1)-(2) together via the DL connector 540 may provide a digit line segment having a length of 2NK rows to match the length of a digit line segment of the inner memory array. In some examples, N may be equal to any integer, such as 1, 2, 4, 8, etc.

In some examples, the sense amplifier 530 may be schematically similar to the sense amplifier 520. In some examples, components of the sense amplifier 530 may have a different (e.g., smaller) size than schematically common components of the sense amplifier 520 to accommodate the differences in digit line segment lengths (e.g., NK vs. 2NK). The sense amplifier 530 having smaller components than the sense amplifier 520 may result in a smaller layout area for the sense amplifier 530 as compared with the sense amplifier 520. In other examples, the sense amplifier 530 may be schematically different than the sense amplifier 520. For example, the sense amplifier 530 may include basic sense amplifier circuitry and the sense amplifier 520 may include threshold voltage compensation circuitry in addition to the basic sense amplifier circuitry to accommodate sensing data on longer digit line segments and the respective combination of the digit line segment 506(1), the DL connector 540, and the access line segment 506(2).

Figure 6:
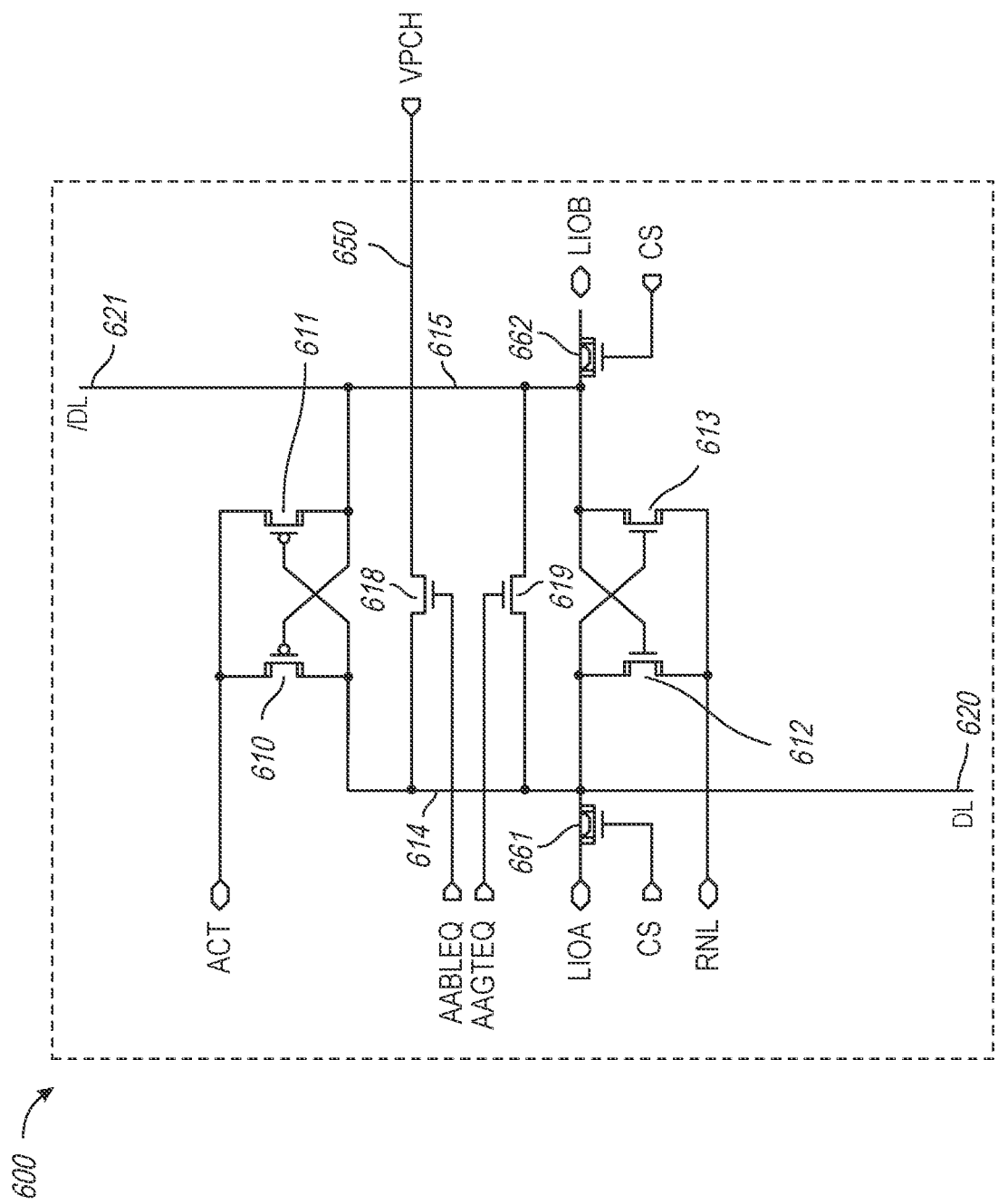
FIG. 6 is a circuit diagram of a sense amplifier in accordance with an embodiment of the disclosure.

FIG. 6 is a circuit diagram of a (e.g., basic or traditional) sense amplifier 600 in accordance with an embodiment of the disclosure. The sense amplifier 600 may be included in one or more of the sense amplifiers 150 of FIG. 1. Any of the sense amplifier banks 220(1), 220(2), 230 of FIG. 2, the sense amplifier banks 320(1), 320(2), 230 of FIG. 3, any of the sense amplifiers 420 or 430 of FIG. 4, or any of the sense amplifiers 520 or 530 of FIG. 5 may implement one or more of the sense amplifiers 600 in some examples. The sense amplifier 600 may include first type of transistors (e.g. p-type field effect transistors (PFET)) 610, 611 having drains coupled to drains of second type of transistors (e.g., n-type field effect transistors (NFET) 612, 613, respectively. The first type of transistors 610, 611 and the second type of transistors 612, 613 form complementary transistor inverters including a first inverter including the transistors 610 and 612 and a second inverter including the transistors 611 and 613. The first type of transistors 610, 611 may be coupled to a Psense amplifier control line (e.g., an activation signal ACT), which may provide a supply voltage (e.g., an array voltage VARY) at an active "high" level. The second type of transistors 612, 613 may be coupled to an Nsense amplifier control line (e.g., a Row Nsense Latch signal RNL) that may provide a reference voltage (e.g., a ground (GND) voltage) at an active "low" level. The sense amplifier 600 may sense and amplify the data state applied to sense nodes 614, 615 through the digit (or bit) lines DL 620 and /DL 621, respectively. The digit lines DL 620 and /DL 621 (sense nodes 614 and 615) may be coupled to local input/output nodes A and B (LIOA/B) through the second type of transistors 661 and 662, respectively, which may be rendered conductive when a column select signal CS is active. LIOT and LIOB may correspond to the LIOT/B lines of FIG. 1, respectively.

The sense amplifier 600 may further include transistors 618, 619, where the transistor 618 may couple the sense node 614 to a global power bus 650 and the transistor 619 may couple the sense node 614 to the sense node 615. The global power bus 650 may be coupled to a node that is configured to provide a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 618 and 619 may couple the global power bus 650 to the sense nodes 614 and 615 responsive to equilibrating signals AAGTEQ and AABLEQ provided on gates of the transistors 618 and 619.

In operation, the sense amplifier 600 may be configured to sense a data state of a coupled memory cell on the digit lines DL 620 and /DL 621 in response to received control signals (e.g., the ACT and RNL signals, the AABLEQ and AAGTEQ equalization signals, and the CS signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof. A sense operation may include an initial precharge/equalize phase and a sense phase.

During the initial precharge/equalize phase of a sense operation, the sense nodes 614 and 615 may be precharged at the VPCH voltage. For example, the global power bus 650 may be supplied with the VPCH voltage, and the AAGTEQ and AABLEQ signals may be in their active states, respectively. Accordingly, while in the initial precharge or standby phase, each of the digit lines DL 620 and /DL 621 and the sense nodes 614 and 615 may be precharged to the precharge voltage VPCH. In some examples, the VPCH voltage may be approximately half of the array voltage.

At the end of the initial precharge/equalize phase or the start of the sense phase, a wordline WL associated with the sense operation may be set to an active state. In some other examples, the wordline WL may be activated during the threshold voltage compensation phase.

During the sense phase, the sense amplifier 600 may sense a data state of memory cell coupled to the digit line DL 620 or/DL 621. After activation of the wordline WL, the ACT signal and the RNL signal being activated and set to the logic high level (e.g., the VARY voltage) and the logic low level (e.g., the GND voltage), respectively. During the sense phase, sense and amplify operations are then performed with the threshold voltage compensation voltage to balance the responses of the second type of transistors 612 and 613. For example, in response to a memory cell being coupled to a digit line DL 620 or/DL 621 through its respective access device, a voltage difference is created between the digit lines DL 620 and /DL 621. The voltage difference is sensed by the second type of transistors 612, 613 as the sources of the second type of transistors 612, 613 begin to be pulled to ground through fully activated RNL signal, and one of the second type of transistors 612, 613 with a gate coupled to the digit line DL 620 or/DL 621 with the slightly higher voltage begins conducting. When a memory cell coupled to sense node 614 via the digit line DL 620 stores a high data state, for example, the transistor 613 may begin conducting. Additionally, the other transistor 612 may become less conductive as the voltage of the sense node 615 with the slightly lower voltage decreases through the conducting transistor 613. Thus, the slightly higher and lower voltages are amplified to logic high and logic low voltages.

After the data state of the memory cell is sensed, and the sense nodes 614, 615 are each pulled to a respective one of the ACT signal and RNL signal voltages, a read may be performed in response to a READ command. For example, the CS signal may be activated (e.g., in response to the READ command), the digit lines DL 620 and /DL 621 (e.g., at sense nodes 614 and 615) may be coupled to the LIO nodes (LIOT and LIOB) and the data output may be provided to the LIO nodes. Thus, the data may be read out from the LIO nodes. After a read operation is completed, the CS signal may be set to an inactive state. The process may start over for a subsequent sensing operation.

Figure 7:
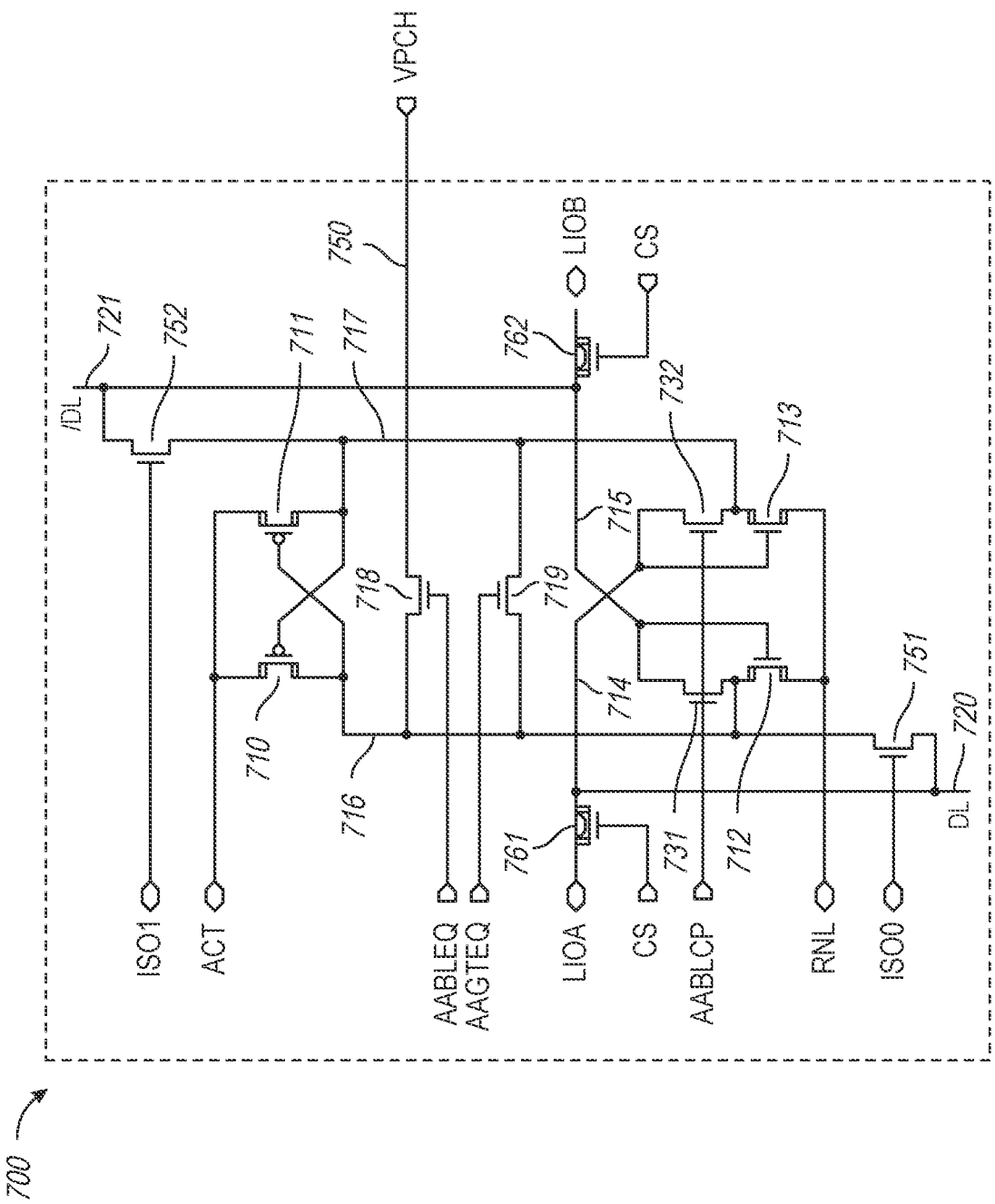
FIG. 7 is a circuit diagram of a threshold voltage compensation (VtC) sense amplifier in accordance with an embodiment of the disclosure.

FIG. 7 is a circuit diagram of a threshold voltage compensation (VtC) sense amplifier 700 in accordance with an embodiment of the disclosure. The VtC sense amplifier 700 may be included in one or more of the sense amplifiers 150 of FIG. 1. Any of the sense amplifier banks 220(1), 220(2), 230 of FIG. 2, the sense amplifier banks 320(1), 320(2), 230 of FIG. 3, any of the sense amplifiers 420 or 430 of FIG. 4, or any of the sense amplifiers 520 or 530 of FIG. 5 may implement one or more of the VtC sense amplifiers 700 in some examples. The VtC sense amplifier 700 may include first type of transistors (e.g. p-type field effect transistors (PFET)) 710, 711 having drains coupled to drains of second type of transistors (e.g., n-type field effect transistors (NFET) 712, 713, respectively. The first type of transistors 710, 711 and the second type of transistors 712, 713 form complementary transistor inverters including a first inverter including the transistors 710 and 712 and a second inverter including the transistors 711 and 713. The first type of transistors 710, 711 may be coupled to a Psense amplifier control line (e.g., an activation signal ACT), which may provide a supply voltage (e.g., an array voltage VARY) at an active "high" level. The second type of transistors 712, 713 may be coupled to an Nsense amplifier control line (e.g., a Row Nsense Latch signal RNL) that may provide a reference voltage (e.g., a ground (GND) voltage) at an active "low" level. The VtC sense amplifier 700 may sense and amplify the data state applied to sense nodes 714, 715 through the digit (or bit) lines DL 720 and /DL 721, respectively. Nodes 716 and 717 that may be gut nodes coupled to drains of the second type of transistors 712, 713 may be coupled to the digit lines DL 720 and /DL 721 via isolation transistors 751 and 752. The isolation transistors 751 and 752 may be controlled by isolation signals ISO0 and ISO1. The digit lines DL 720 and /DL 721 (sense nodes 714 and 715) may be coupled to local input/output nodes A and B (LIOA/B) through the second type of transistors 761 and 762, respectively, which may be rendered conductive when a column select signal CS is active. LIOT and LIOB may correspond to the LIOT/B lines of FIG. 1, respectively.

The VtC sense amplifier 700 may further include additional second type of transistors 731, 732 that have drains coupled to the sense nodes 715 and 714 and sources coupled to both the gut nodes 716 and 717 and the drains of the second type of transistors 712 and 713. Gates of the second types of transistors 731, 732 may receive a bit line compensation signal AABLCP and may provide voltage compensation for threshold voltage imbalance between the second type of transistors 712 and 713. The VtC sense amplifier 700 may further include transistors 718, 719, where the transistor 718 may couple the gut node 716 to a global power bus 750 and the transistor 719 may couple the gut node 716 to the gut node 717. The global power bus 750 may be coupled to a node that is configured to provide a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 718 and 719 may couple the global power bus 750 to the gut nodes 716 and 717 responsive to equilibrating signals AAGTEQ and AABLEQ provided on gates of the transistors 718 and 719.

In operation, the VtC sense amplifier 700 may be configured to sense a data state of a coupled memory cell on the digit lines DL 720 and /DL 721 in response to received control signals (e.g., the ISO0/ISO1 isolation signals, the ACT and RNL signals, the AABLEQ and AAGTEQ equalization signals, the CS signal, and the AABLCP signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof. A sense operation may include several phases, such as an initial precharge or standby phase, a compensation phase, a gut equalize phase, and a sense phase.

During the initial precharge or standby phase of a sense operation, the gut nodes 716 and 717 may be precharged at the VPCH voltage. For example, the global power bus 750 may be supplied with the VPCH voltage and the AABLCP signal, the ISO0/ISO1 signals, and the AAGTEQ and AABLEQ signals may be in their active states, respectively. Accordingly, while in the initial precharge or standby phase, each of the digit lines DL 720 and /DL 721, the sense nodes 714 and 715 and the gut nodes 716 and 717 may be precharged to the precharge voltage VPCH. In some examples, the VPCH voltage may be approximately half of the array voltage.

After the initial precharge or standby phase, the VtC sense amplifier 700 may enter the threshold voltage compensation phase, where voltages on the digit lines DL 720 and /DL 721 are biased from the VPCH voltage (e.g., VBLP voltage) to compensate (e.g., provide threshold voltage compensation) for threshold voltage differences between the transistors 712, 713. During the compensation phase, the ISO0 and ISO1 signals and the AAGTEQ and AABLEQ signals may be set to respective inactive state to disable the transistors 751, 752, 718 and 719. The AABLCP signal may remain in an active state to enable the transistors 331 and 332 to couple the nodes 714 and 715 to the gut nodes 717 and 716, respectively. Additionally, the drain and the gate of the transistor 712 may be coupled and the drain and the gate of the transistor 713 may be coupled. At the end of the threshold voltage compensation phage, the AABLCP signal may transition to an inactive state, which disables the transistors 731 and 732 and decouples the nodes 714 and 715 from the gut nodes 717 and 716, respectively.

During the gut equalize phase, the gut nodes 717 and 716 may be decoupled from the digit lines DL 720 and /DL 721 and may be coupled to each other to equalize voltages between the gut nodes 716, 717 to the VPCH voltage. During this phase, the AAGTEQ and AABLEQ signals may transition to an active state. While the AABLCP signal is set to the inactive state, the transistors 732 and 731 may decouple the nodes 714 and 715 from the gut nodes 717 and 716. While the equilibrating signals AAGTEQ and AABLEQ are set to the active state, the transistors 718 and 719 may couple the VPCH voltage from the global power bus 750 to the gut nodes 716, 717. While the ISO0 and ISO1 signals are set to the inactive state, the isolation transistors 751 and 752 may decouple the gut nodes 717 and 716 from the digit lines DL 720 and /DL 721. After the to the gut nodes 716 and 717 are precharged to the VPCH voltage, the AAGTEQ and AABLEQ signals may be set to inactive states to disable the transistors 718 and 719. Also during the gut equalization phase, a wordline WL associated with the sense operation may be set to an active state. In some other examples, the wordline WL may be activated during the threshold voltage compensation phase.

During the sense phase, the VtC sense amplifier 700 may sense a data state of memory cell coupled to the digit line DL 720 or/DL 721. Initially, the ISO0 and ISO1 isolation signals may be set to an active state, followed by the ACT signal and the RNL signal being activated and set to the logic high level (e.g., the VARY voltage) and the logic low level (e.g., the GND voltage), respectively. Responsive to the ISO0 and ISO1 isolation signals transitioning to the active state, the ISO transistor 751 may couple the digit line DL 720 to the gut node 716 and the ISO transistor 752 may couple the digit line/DL 721 to the gut node 717. During the sense phase, sense and amplify operations are then performed with the threshold voltage compensation voltage to balance the responses of the second type of transistors 712 and 713. For example, in response to a memory cell (e.g., one of the memory cells 240(0)-(N) or memory cells 241(0)-(N) of FIG. 2) being coupled to a digit line DL 720 or/DL 721 through its respective access device, a voltage difference is created between the digit lines DL 720 and /DL 721 (e.g., via the guts nodes 716 and 717). The voltage difference is sensed by the second type of transistors 712, 713 as the sources of the second type of transistors 712, 713 begin to be pulled to ground through fully activated RNL signal, and one of the second type of transistors 712, 713 with a gate coupled to the digit line DL 720 or/DL 721 with the slightly higher voltage begins conducting. When a memory cell coupled to the gut node 716 through the digit line DL 720 stores a high data state, for example, the transistor 713 may begin conducting. Additionally, the other transistor 712 may become less conductive as the voltage of the gut node 717 with the slightly lower voltage decreases through the conducting transistor 713. Thus, the slightly higher and lower voltages are amplified to logic high and logic low voltages while the isolation signals ISO0 and ISO1 in the active state.

Because the isolation signals ISO0 and ISO1 were set active to couple the gut nodes 716, 717 to the respective digit lines DL 720 and /DL 721 prior to activating sense amplifier (e.g., setting the ACT signal and the RNL signal active), the gut nodes 716, 717 (e.g., and digit lines DL 720 and /DL 721) may be steadily driven to the ACT and RNL voltages, respectively.

After the data state of the memory cell is sensed, and the sense nodes 714, 715 are each pulled to a respective one of the ACT signal and RNL signal voltages, a read may be performed in response to a READ command. For example, the CS signal may be activated (e.g., in response to the READ command), the digit lines DL 720 and /DL 721 (e.g., at sense nodes 714 and 715) may be coupled to the LIO nodes (LIOT and LIOB) and the data output may be provided to the LIO nodes. Thus, the data may be read out from the LIO nodes. After a read operation is completed, the CS signal may be set to an inactive state. The process may start over for a subsequent sensing operation.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
  a first memory array mat formed adjacent an edge of a second memory array mat, the first memory array mat comprising:
  a first pair of access line segments each configured to connect to a respective sense amplifier of a first sense amplifier bank formed between the first pair of access line segments; and
  a second pair of access line segments each configured to connect together via across the first sense amplifier bank via an access line connector to form a combined access line segment, wherein the combined access line segment is configured to connect to a second sense amplifier of a second sense amplifier bank.

2. The apparatus of claim 1, wherein the access line connector and the first pair of access line segments are both formed in a common metal layer.

3. The apparatus of claim 1, wherein the first memory array mat is an edge memory array mat.

4. The apparatus of claim 1, wherein the second sense amplifier bank is formed between the first and second memory array mats.

5. The apparatus of claim 1, wherein the first pair of access line segments and the second pair of access line segments are each coupled to a same number of rows of memory cells.

6. The apparatus of claim 1, wherein the combined access line segment is coupled to more rows of memory cells than each of the first pair of access line segments.

7. The apparatus of claim 1, wherein the second sense amplifier is coupled to another access line segment of the second memory array mat.

8. The apparatus of claim 1, wherein the first sense amplifier is schematically similar to the second sense amplifier.

9. The apparatus of claim 1, wherein the first sense amplifier includes threshold voltage compensation circuitry.

10. The apparatus of claim 1, wherein the first and second sense amplifiers are formed using a complementary, metal-oxide semiconductor (CMOS) under array process.

11. The apparatus of claim 1, wherein the first and second memory array mats each include respective memory cells formed using a one transistor, one capacitor architecture.

12. The apparatus of claim 1, wherein the first and second memory array mats each include respective memory cells formed using a two transistor, two capacitor architecture.

13. An apparatus comprising:
an edge memory array mat comprising a first plurality of access line segment pairs each coupled to a respective sense amplifier of a sense amplifier bank and a second plurality of access line pairs each coupled to together via a respective access line connector configured to extend across the sense amplifier bank to form respective single access lines coupled to a second sense amplifier bank.

14. The apparatus of claim 13, wherein the sense amplifier bank is formed in a different plane than the edge memory array mat.

15. The apparatus of claim 13, wherein the sense amplifier bank is formed in a gap within the edge memory array mat.

16. The apparatus of claim 13, wherein the respective access line connectors and the first plurality of access line segment pairs are formed in a common metal layer.

17. The apparatus of claim 14, wherein the sense amplifier bank is formed in a layer different than the common metal layer.

18. The apparatus of claim 13, wherein a sense amplifier of the second sense amplifier bank includes threshold voltage compensation circuitry.

19. The apparatus of claim 13, wherein the edge memory array mat includes memory cells formed using a one transistor, one capacitor architecture.

20. The apparatus of claim 13, wherein the edge memory array mat includes memory cells formed using a two transistor, two capacitor architecture.

* * * * *